(12) United States Patent
Rupin

(10) Patent No.: US 12,210,683 B2
(45) Date of Patent: Jan. 28, 2025

(54) METHOD FOR CREATING A HAPTIC EFFECT BY MEANS OF FOCUSED ULTRASOUND WAVES

(71) Applicant: VIBRA NOVA, Saint-Paul-de-Varces (FR)

(72) Inventor: Matthieu Rupin, Saint Martin d'Hères (FR)

(73) Assignee: VIBRA NOVA, Saint-Paul-de-Varces (FR)

( * ) Notice: Subject to any disclaimer, the term of this patent is extended or adjusted under 35 U.S.C. 154(b) by 817 days.

(21) Appl. No.: 17/414,028

(22) PCT Filed: Dec. 30, 2019

(86) PCT No.: PCT/FR2019/000222
§ 371 (c)(1),
(2) Date: Jun. 15, 2021

(87) PCT Pub. No.: WO2020/141263
PCT Pub. Date: Jul. 9, 2020

(65) Prior Publication Data
US 2022/0050526 A1    Feb. 17, 2022

(30) Foreign Application Priority Data
Dec. 31, 2018    (FR) .................................... 18 74414

(51) Int. Cl.
*H01L 41/09* (2006.01)
*G06F 3/01* (2006.01)
*H10N 30/20* (2023.01)

(52) U.S. Cl.
CPC ........... *G06F 3/016* (2013.01); *H10N 30/204* (2023.02)

(58) Field of Classification Search
CPC .................................................. H10N 30/204
See application file for complete search history.

(56) References Cited

U.S. PATENT DOCUMENTS

| 8,593,409 B1 | 11/2013 | Heubel et al. |
| 2014/0071079 A1* | 3/2014 | Heubel ................. B06B 1/0629 345/173 |

(Continued)

FOREIGN PATENT DOCUMENTS

WO    2008116980 A1    10/2008

OTHER PUBLICATIONS

International Search Report (PCT/ISA/210) and Written Opinion (PCT/ISA/237) mailed on May 8, 2020, by the European Patent Office as the International Searching Authority for International Application No. PCT/FR2019/000222.

*Primary Examiner* — Bryan P Gordon
(74) *Attorney, Agent, or Firm* — BUCHANAN, INGERSOLL & ROONEY PC

(57) ABSTRACT

The invention concerns a method for generating a haptic effect at a target point of a solid by using at least two piezoelectric actuators capable of emitting, at a given instant t, a wave under the effect of ultrasonic frequency control signals capable of creating vibrations at the surface of the solid in such a way as to create an ultrasonic lubrication effect ("squeeze film" effect) at the target point. The respective control signal of each actuator is calculated depending on the distance between the respective actuator and the target point to be actuated, such that the surface deformations obtained at the target point under consideration combine to create a haptic effect there greater than that obtained when using a single actuator.

8 Claims, 2 Drawing Sheets

(56) References Cited

U.S. PATENT DOCUMENTS

| | | | |
|---|---|---|---|
| 2015/0241393 A1* | 8/2015 | Ganti | G01N 29/09 73/589 |
| 2016/0132117 A1* | 5/2016 | Adachi | G06F 3/041 345/173 |
| 2017/0293259 A1* | 10/2017 | Ochiai | G02B 3/0006 |
| 2017/0320210 A1* | 11/2017 | Ding | B25J 9/1661 |

* cited by examiner

METHOD FOR CREATING A HAPTIC EFFECT BY MEANS OF FOCUSED ULTRASOUND WAVES

The invention relates to the field of surfaces capable of generating a haptic feedback effect, in particular via ultrasonic lubrication, when they are touched by the finger of a user.

PRIOR ART

It is known that ultrasonic lubrication of a surface, via modification of the coefficient of friction of the surface, may be used to create a haptic effect that takes the form of a sensation of texture, also called the "squeeze-film effect", under the finger of a user. This effect is obtained by making the surface vibrate by applying an ultrasonic standing wave, as is already known from document WO2008116980 A1.

This effect requires high-amplitude ultrasonic movements of the surface, which are obtained at the present time by virtue of an overall resonance of the surface (elastic thin plate). This resonance plays the role of passive amplifier and yields good results when the surface is essentially elastic and absorbs very little the energy of the ultrasonic vibration that is applied to it, such as is the case with a glass surface for example.

In contrast, when the medium used to obtain haptic feedback is too massive, or highly dissipative as regards elastic surface waves in the ultrasonic frequency domain, or when the point to be actuated on the surface is far from the actuators, it is, at the current time, difficult to obtain high-quality haptic feedback, i.e. to obtain high amplitudes of movement of the surface that are clearly perceptible by the user, with an acceptable energy efficiency. Furthermore, in dissipative media, the piezoelectric actuator that generates the ultrasonic vibration must be located in close proximity to the point on the surface where the effect is to be generated, this excluding application to transparent surfaces, in the absence of piezoelectric actuators that are themselves transparent.

AIM OF THE INVENTION

The general aim of the invention is to extend the field of application of haptic feedback via ultrasonic lubrication to a wider variety of media, for example to media, such as wood or plastics for example, that are relatively dissipative, or more generally to so-called viscoelastic media, or even to media that are elastic but thicker than the media with which the effect of ultrasonic lubrication is already used.

Another aim of the invention is to allow clearly perceptible haptic feedback to be obtained at points on a surface that are far from the location of the actuators, as may be useful for example with glass surfaces in the construction industry.

Yet another aim of the invention is to allow multipoint haptic feedback to be obtained, i.e. differentiated but simultaneous haptic feedback at various points of a solid.

PRINCIPLE OF THE INVENTION

The present invention describes a method for obtaining this effect of localized ultrasonic lubrication under the finger of the user by means of focused ultrasound.

The principle of the invention consists in using the principle of wave focusing, and in particular the principle of focusing elastic surface waves in the range of the ultrasonic frequencies, to obtain high amplitudes of movement at a focal point in media that are dissipative or too massive or too far from the actuators to be easily actuated. To this end, control of the actuators is optimized to create a sensation of texture under the finger of the user via the modification of the coefficient of friction at the focal point.

SUBJECT OF THE INVENTION

One subject of the invention is therefore a method for generating, at a target point (R) of a solid, a haptic effect using at least two piezoelectric actuators ($S_i$) capable of emitting, at a given time t, under the effect of control signals, a wave of ultrasonic frequency, said actuators being able to create vibrations on the surface of the solid, so as to create an effect, referred to as the "ultrasonic lubrication" effect (or "squeeze film" effect), at the target point (R), characterized in that the respective control signal of each actuator ($S_i$) is computed depending on the distance ($d_i$) between this actuator and the target point (R) to be actuated, so that the surface deformations obtained at the target point in question sum to create, at said point, a haptic effect greater than that obtained using a single actuator.

According to one embodiment, the vibrations generated by the piezoelectric actuators ($S_1$) at the surface of the solid correspond to bending waves.

Another subject of the invention is a device for generating a haptic effect at a target point (R) of a solid, characterized in that it comprises at least two actuators ($S_1$, $S_2$) capable of emitting, at a given time ($t_1$, $t_2$), a surface wave under the effect of a control signal of each actuator, and control means configured so that the respective control signal sent to each actuator is computed depending on the distance between this actuator and the target point (R) to be actuated, so that the surface deformations obtained at the target point in question sum to create, at said point, a haptic effect greater than that obtained using a single actuator.

According to one embodiment, the solid is a viscoelastic solid, such as wood or a plastic for example.

Preferably, said solid is isotropic with respect to wave propagation, so as to simplify the computation of the delay times between the control signals required to obtain a good focus at a targeted target point.

According to one embodiment, the solid is a surface that is transparent to light, and a plurality of actuators are positioned on a border of said surface.

According to another embodiment, the solid is a surface that is opaque to light, and a plurality of actuators are positioned at various points on the surface, for example in a region in which the actuators will not be visible.

According to one advantageous embodiment, the actuators are piezoelectric actuators.

DETAILED DESCRIPTION

The invention will be described in more detail with reference to the figures, in which.

Figure 1:
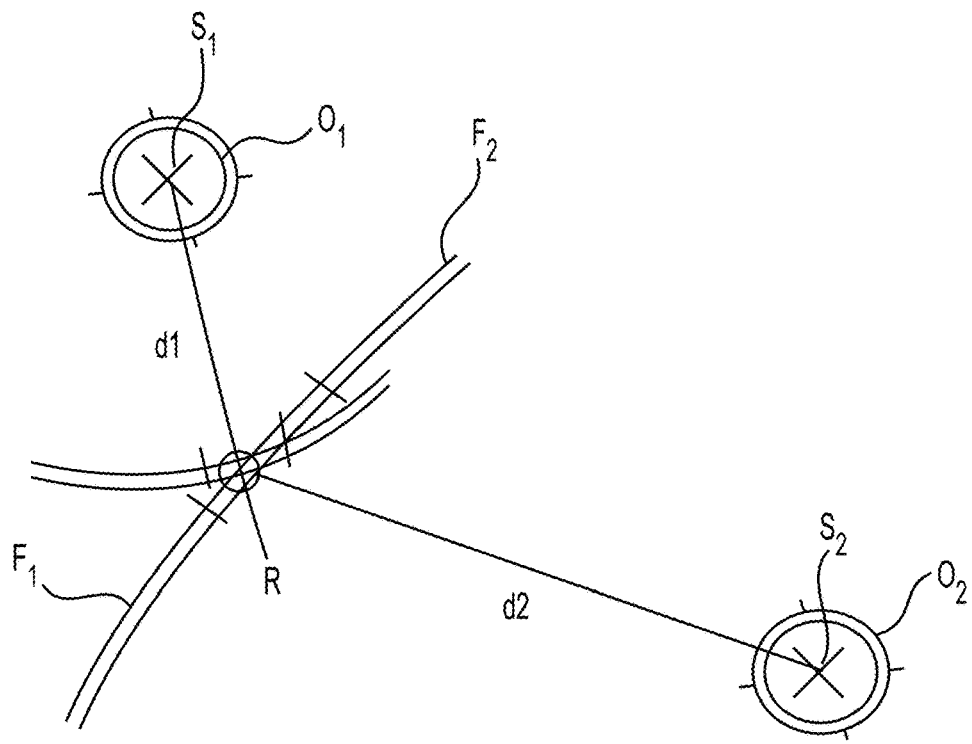
FIG. 1 illustrates the principle of focusing of elastic surface waves in a solid with two actuators.

FIG. 1 illustrates the principle of summation, at a point to be actuated, of the elastic waves $O_1$, $O_2$ emitted by two point sources $S_1$, $S_2$ distant by a distance $d_1$, $d_2$, respectively. The sources $S_1$, $S_2$ each emit a wave, for example an ultrasonic wave created by piezoelectric actuators (not shown). The wave fronts $F_1$, $F_2$ of the waves $O_1$, $O_2$ intersect at the point R and create, at said point, a deformation perpendicular to the plane of the surface containing the sources $S_1$, $S_2$, in the case of a bending surface wave (A0 Lamb wave in the particular case of a thin plate), and an ultrasonic movement denoted w in the general case.

The out-of-plane movement w, obtained at the point $\vec{r}$ by two sources located at the points with i=1,2, is expressed by the following relationship:

$$w(\vec{r}, t_0) = \Sigma_{i=1}^{2} \int_{tj}^{t0} G(r, s \vec{-} i; t, ti) f(s \vec{-} i, ti) dt \qquad (1)$$

where $f(\vec{s}, t)$ represents the source functions, emitted at the points $s_i$ and at the initial times $t_i$, and $G(\vec{r}, \vec{s}_i; t, t_i)$ are the Green's functions between the source points and the focal point $\vec{r}$. The time $t = t_0$ corresponds to the time at which the waves generated by the two sources $S_1$, $S_2$ sum constructively at the point $\vec{r}$. The emission times t are defined on the basis of knowledge of the speed of the bending waves in the medium via the following relationship:

$$t_i = t_0 - d_i/c(\omega) \qquad (2)$$

Equation 1 therefore represents a set of products of the convolution of two sources and a reception point located at $\vec{r}$.

In the case where the signals to be generated have a single frequency (monochromatic signals), equation (1) remains true and the time delays $t_i$ of equation (2) correspond to phase shifts. Specifically, for monochromatic signals, the vibration may be written in the Fourier domain in the form of a complex number the absolute value of which corresponds to the amplitude of the oscillation and the argument of which expresses the spatial and temporal distribution of the vibration. Thus, during the emission by a plurality of point sources of a monochromatic signal, it is important for the argument of these different contributions to have the same value at the target point (R) (case of vibrations that are in phase). Thus, with $\varphi(R, S_i)$ the argument of the vibrations perceived at the target point (R) following the emission from the point source $S_i$, the following is obtained, in the plane-wave approximation and omitting the term related to the temporal oscillation:

$$\varphi(R, S_i) = e^{-ik|\overrightarrow{rs_i}|}$$

With:

$$|\overrightarrow{rs_i}|$$

the distance between the target point (R) and the point source $S_i$, k the wave number.

In order to obtain signals generated by different point sources that are in phase at the target point (R), it is necessary to add a phase shift to the additional point sources, which is expressed as follows:

$$k\Delta d$$

with $\Delta d$ the difference in distance between the point source taken as reference (arbitrary) and the one or more additional point sources. By way of illustration, in the particular case of two point sources $S_1$ and $S_2$, and taking as a reference the point $S_1$, the vibration perceived at the target point (R) is made up of the sum of the contributions of S1 and S2:

$$\varphi(R, S_i) = e^{-ik|\overrightarrow{rs_1}|} + e^{-ik(|\overrightarrow{rs_2}| + \Delta d)}$$

This focusing principle may be used to focus surface ultrasonic waves generated by a higher number of sources.

Specifically, the out-of-plane movement obtained at a point on a surface may be insufficient to be perceptible by a finger when it is produced only via summation of two waves generated by two actuators, or when the point to be actuated is too far from the location of the actuators and the propagation medium is viscoelastic. In these cases, it is useful to use a higher number of actuators placed at a non-obtrusive place on the surface to be actuated, but it is then necessary for the ultrasonic vibrations to be driven so that a haptic feedback may be generated coherently at the point targeted.

Figure 2:
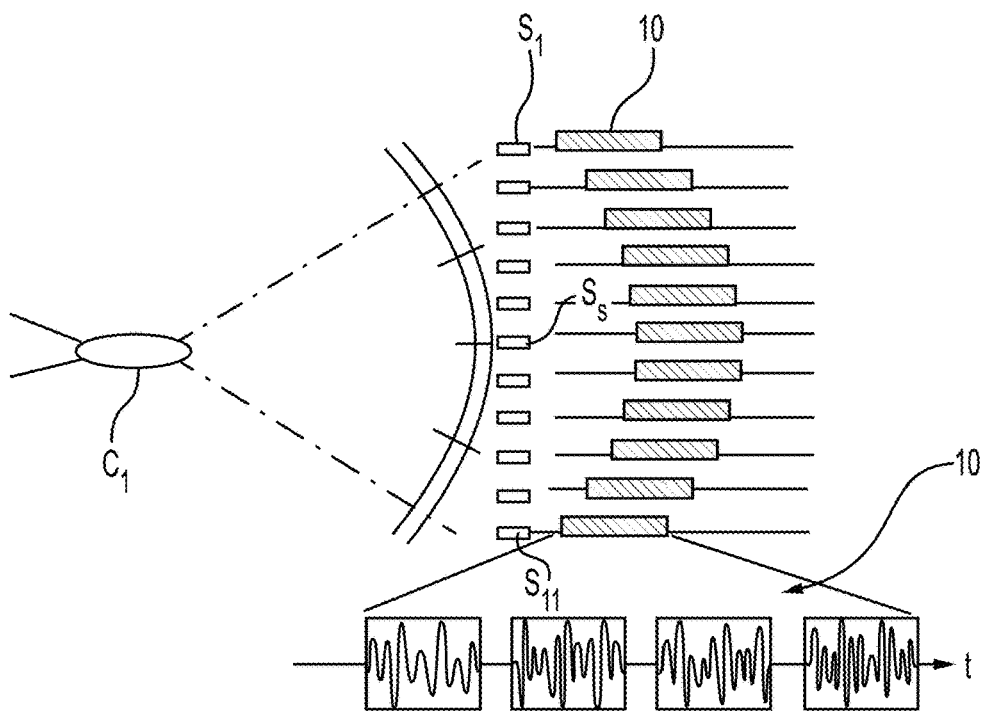
FIG. 2 is a schematic view of a set of ultrasonic actuators arranged in a straight line and driven to create a focused elastic surface wave at a point of a solid.

An exemplary embodiment using multiple sources is shown in FIG. 2. This figure shows a small region C1 of an isotropic solid, which region must be actuated by a plurality of actuators, and especially 11 piezoelectric actuators referenced $S_1$ to $S_{11}$. The various actuators $S_i$ are actuated by control signals delivering vibratory waves 10, as shown schematically in the enlarged graph at the bottom of FIG. 2. According to the invention, the wave trains are shifted in time so as to sum constructively at the target point C1. For example, the control signal applied to the actuator $S_6$, which is closest to the target zone C1, is delayed with respect to the control signal of the neighboring actuators. The delay is computed so as to maximize the movement due to the summation at the target point C1 of the waves generated by all the actuators.

Of course, if several target points are to be targeted, it is enough to recompute the delay times of the control signals of the various actuators to maximize the focus of the ultrasonic waves at such or such a point in question.

This way of proceeding makes it possible to envisage creating clearly perceptible haptic effects in a high number of new situations of application.

Figure 3:
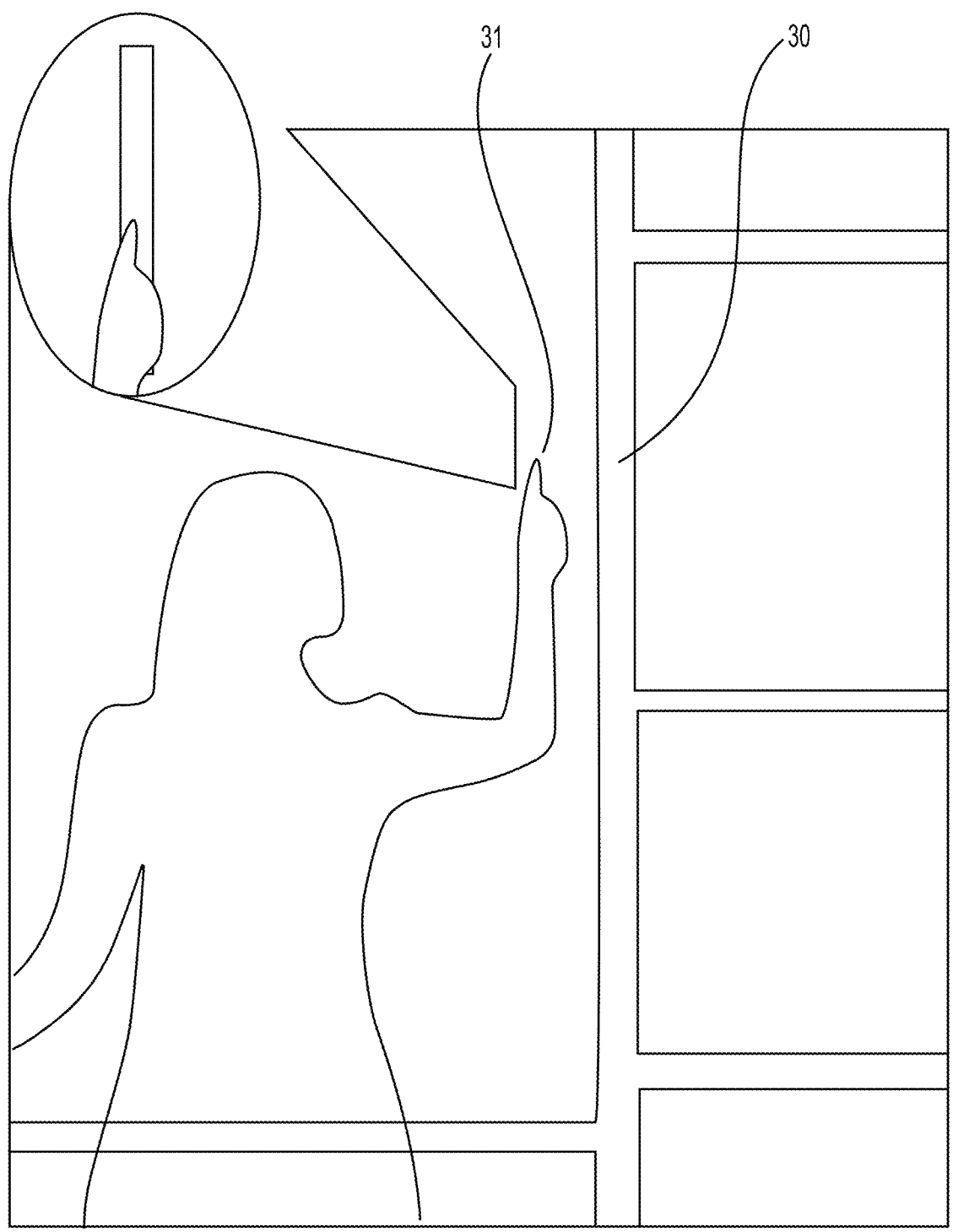
FIG. 3 illustrates one possible use of the method according to the invention, to actuate a point of a transparent surface.

A completely non-limiting example of application is schematically shown in FIG. 3. A set of actuators (not shown) is placed in a row in a region 30 on the border of an architectural glazing. It is desired to create a haptic effect via ultrasonic lubrication at point 31 of the glazing, which is far from the region 30. Given the distance between the border of the glazing and the target point 31, prior-art technologies would not allow a perceptible haptic effect to be generated at the target point 31, unless a large visible actuator were placed directly in the vicinity of the target point. On the contrary, the invention allows a series of actuators to be remotely placed in a far-off region that is not obtrusive from the visual point of view, and a clearly perceptible actuation to be obtained at the target point 31. Furthermore, a plurality of target points may be targeted: all that is required is to compute the delay laws of the control signals so as to maximize the movement of the glass surface at any targeted point.

ADVANTAGES OF THE INVENTION

The invention allows the set aims to be achieved. In particular, the method according to the invention allows a haptic squeeze-film effect to be generated at points on a surface that are far from the position of the piezoelectric actuators, or at points on a surface the material of which is viscoelastic. Hence, the invention allows the field of application of haptic feedback technologies based on the squeeze-film effect to be considerably broadened, for example to the sector of smart architectural or automotive glazings, but also to other sectors of application such as the sector of furniture using materials such as wood or plastics.

The invention claimed is:

1. A method for generating an ultrasonic haptic feedback effect at a target point of a surface of a solid, using at least two piezoelectric actuators capable of generating at said target point an ultrasonic vibration configured to create an effect, referred to as the ultrasonic lubrication effect, wherein each of said piezoelectric actuators is controlled by a respective control signal using a delay depending on the wave propagation speed of the control signals inside the solid and on a distance (di) between each of said piezoelectric actuators and the target point to be actuated, and wherein the delay of the control signals is determined so that the amplitude of the surface deformations obtained at said target point sum up to create, at said target point, an ultrasonic haptic effect greater than that obtained using a single actuator.

2. The method as claimed in claim 1, wherein the vibrations generated by the piezoelectric actuators at the surface of the solid correspond to bending waves.

3. A device for generating, at a target point of a solid, an ultrasonic haptic feedback effect using a method as claimed in claim 1, said device comprising at least two piezoelectric actuators capable of emitting, at a given time t, a surface wave under the effect of a control signal of each actuator, and a controller of said actuators configured so that the respective control signal sent to each actuator is computed depending on the wave propagation speed of the control signals inside the solid and on a distance between each of said actuators and the target point to be actuated, so that the surface deformations obtained at said target point sum up to create, at said target point, an ultrasonic haptic effect greater than that obtained using a single actuator.

4. The device as claimed in claim 3, wherein said solid is a viscoelastic solid.

5. The device as claimed in claim 3, wherein said solid is isotropic with respect to wave propagation.

6. The device as claimed in claim 5, wherein said solid is a surface that is transparent to light, and wherein a plurality of actuators are positioned on a border of said surface.

7. The device as claimed in claim 5, wherein said solid has a surface that is opaque to light, and wherein a plurality of actuators are positioned at various points on the surface.

8. The device as claimed in claim 5, wherein said actuators are amplified actuators.

* * * * *